United States Patent
Golding et al.

(10) Patent No.: US 7,888,251 B2
(45) Date of Patent: Feb. 15, 2011

(54) PHOTO-ASSISTED HYDROGENATION PROCESS

(75) Inventors: Terry D. Golding, Ardmore, OK (US); Ronald Paul Hellmer, Round Rock, TX (US)

(73) Assignee: Amethyst Research, Inc., Ardmore, OK (US)

( * ) Notice: Subject to any disclaimer, the term of this patent is extended or adjusted under 35 U.S.C. 154(b) by 632 days.

(21) Appl. No.: 11/716,205

(22) Filed: Apr. 19, 2007

(65) Prior Publication Data

US 2008/0268658 A1    Oct. 30, 2008

(51) Int. Cl.
*H01L 21/223*    (2006.01)
*H01L 21/268*    (2006.01)

(52) U.S. Cl. .............................. 438/535; 257/E21.212; 257/E21.357; 257/E21.475; 438/91; 438/796

(58) Field of Classification Search .......... 257/E21.212, 257/E21.355, E21.357, E21.603, E21.698, 257/E21.475; 438/91, 492, 500, 535, 795, 438/796

See application file for complete search history.

(56) References Cited

U.S. PATENT DOCUMENTS 7,012,013 B1 *   3/2006   Okoroanyanwu et al.   ... 438/584

2009/0309623 A1 *   12/2009   Holland et al.   .............. 324/765

OTHER PUBLICATIONS

WM. C. Hughes, M.L. Swanson and J.C. Austin, Observation of indium-Vacancy and Indium-Hydrogen Interactions in Hg1-xCDxTe, Journal of Electronic Materials, vol. 22, No. 8, 1993, pp. 1011-1016.

J.T. Cheung, S.H. Shin, J.G. Pasko and R.E. Dewames; In situ studies of the effect of various gaseous species and ultraviolet . . . ; 1992 American Vacuum Society; J. Vac. Sci. Technol. B 10(4), Jul./Aug. 1992, pp. 1538-1542.

Y.F. Chen and W.S. Chen; Influence of hydrogen passivation on the infrared spectra of Hg0.8Cd0.2Te; Appl. Phys. Lett. 59 (6) Aug. 5, 1991; pp. 703-705.

LexisNexis Search; Search Terms; "hydrogenation and photo-assisted"; pp. 1-3.

American Physical Society Meeting, Baltimore Convention Centers; Mar. 15, 2006; Abstract Q1.00327: "Hydrogenation of Semiconductors Using an Ultra-Violet Light Source"; p. 1.

* cited by examiner

*Primary Examiner*—Anh Phung
*Assistant Examiner*—Michael Lulis
(74) *Attorney, Agent, or Firm*—Tomlinson Rust McKinstry Grable

(57) ABSTRACT

Apparatus and method are provided for hydrogenating semiconductor or other materials by ultraviolet (UV) radiation in the presence of hydrogen. Hydrogen uptake may be optimized by selection of temperature and wavelength of the UV radiation. Patterned areas may be selectively hydrogenated, such as mesas in Avalanche Photodiode Arrays.

8 Claims, 7 Drawing Sheets

1  Uncapped HgCdTe D2  UV 80C 10 hr  (Sample 6 Table 1)
2  Capped HgCdTe D2 80C no UV  (Sample 4 Table 1)
3  Uncapped HgCdTe Untreated

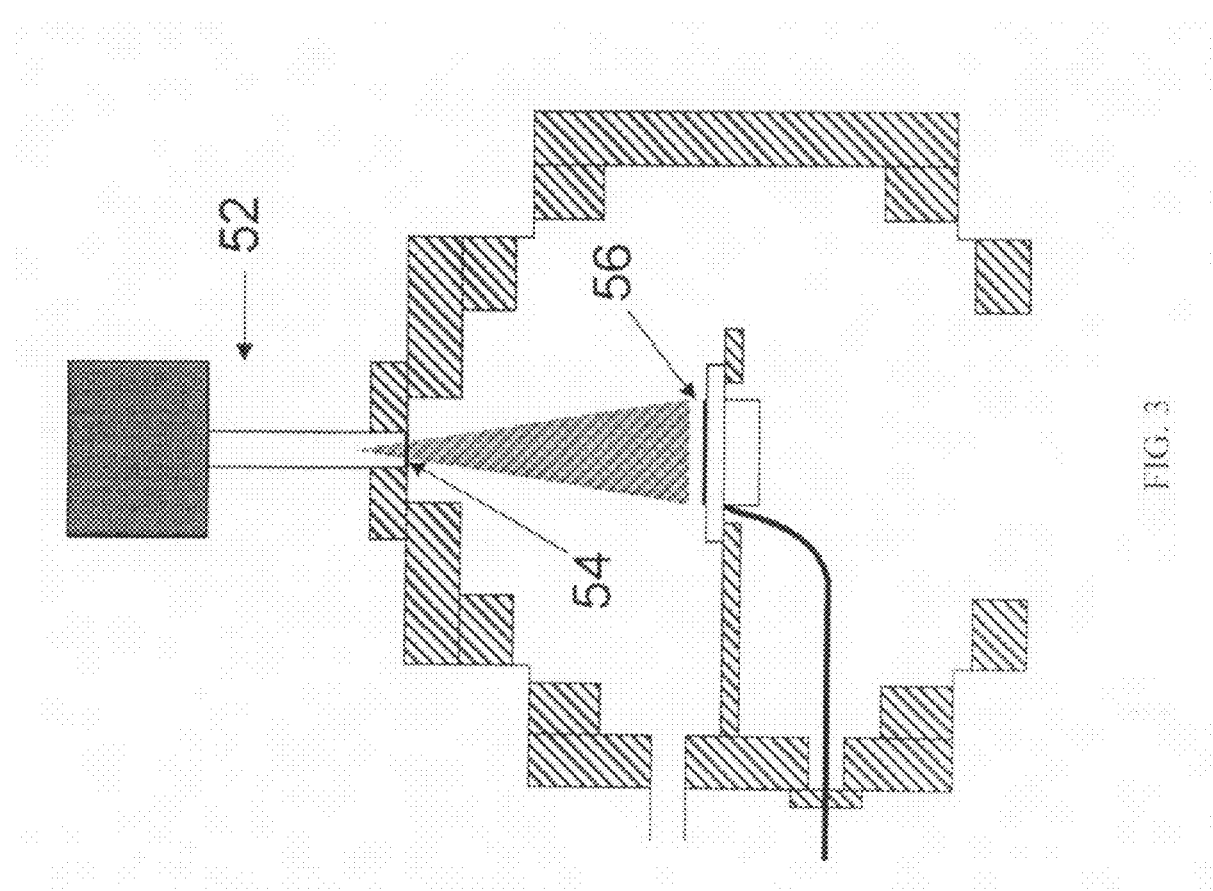

PHOTO-ASSISTED HYDROGENATION PROCESS

BACKGROUND OF THE INVENTION

1. Field of the Invention

This invention pertains to a process for hydrogenating semiconductor materials. More particularly, a process to deliver hydrogen to selected areas of semiconductor structures by radiating the selected areas with ultraviolet radiation while in hydrogen is provided.

2. Description of Related Art

Within crystalline materials hydrogen interacts with broken or weak covalent bonds, such as those found at extended and localized defect centers. The main results of these interactions are shifts of energy levels out of (or into) the gap. The shift in the energy levels can lead to the passivation of the electrical activity of various centers. The consequences of these interactions are substantial changes in the electrical and optical properties of the materials and in the carrier lifetime.

Primarily for these reasons, hydrogen has been used extensively to influence the electrical properties of Si and III-V materials, as well as a number of heterostructure systems, such as GaAs/Si, GaAs/InP, and epitaxial/homoepitaxial InP/InP, among others (e.g. hydrogenation is performed as the last step of polycrystalline-silicon solar cell processing, significantly improving the performance of these cells).

There is a significant demand for improved detectors across the infrared (IR) spectrum, particularly in terms of increased spectral range, pixel sensitivity, pixel density and functionality (e.g. multi-spectral sensors). Many types of systems have been or are being developed that include IR detectors based on Schottky barriers on silicon, extrinsic Si, lead tin telluride, SiGe heterojunctions, AlGaAs multiquantum wells, InAs/InGaSb strained layer superlattices, and high-temperature superconductors. However none of these can compete with HgCdTe in terms of fundamental properties and quantum efficiency. While some of these materials may presently have more manufacturability, they will never provide a higher performance, or, with the exception of thermal detectors, operate at higher or comparable temperatures. In addition, very few systems can compete with HgCdTe simply in terms of the spectral range of operation, since its bandgap can be continuously adjusted across the corresponding IR spectral range by varying the alloy composition (Hg to Cd ratio). Thus, HgCdTe can be used for sensors with cutoff wavelengths ranging from short wavelength or near infrared (NIR, SWIR: 1-2 μm), medium wavelength (MWIR: 3-5 μm) to long wavelength (LWIR: 8-12 μm), and very long wavelength (VLWIR: 12-16 μm). For these reasons, HgCdTe is claimed to be the third most technologically important semiconductor after Si and Ge.

All device grade HgCdTe is now thin-film and grown by liquid-phase epitaxy (LPE) or molecular-beam epitaxy (MBE). However, the quality of epitaxially grown HgCdTe may suffer due to poor substrate quality. Defects within the active regions of HgCdTe devices lead to tunneling dark currents even during low temperature operation, i.e. an operability limitation of the focal plane array (FPA).

HgCdTe diode arrays also suffer from problems related to the lack of a suitable lattice-matched, large-area growth substrate. Due to the availability of large area and low cost substrates, Si is considered to be, by far, the most promising substrate for the next generation of HgCdTe devices. However, its 19% lattice mismatch with HgCdTe presents a significant technological hurdle since it leads to additional defects during growth that degrade the performance of HgCdTe devices. Hydrogen has been demonstrated to passivate these defects. Thus, hydrogenation appears to solve many of the current problems related to HgCdTe devices. However, in order to realize this benefit, cost effective hydrogenation processes must be developed.

To date, hydrogenation has always been achieved using a glow discharge technique (or a very crude approach such as boiling in water). There are no reports known to the inventors of hydrogen incorporation into semiconductors or any materials using UV and hydrogen gas.

Reports on studies of hydrogen passivation in Te-based II-VI's are limited. To the inventors' knowledge, there are only three reports of hydrogenation of HgCdTe (all of which are commented on below), and none of these reports is directly related to dislocation passivation. The studies do provide some insight into hydrogenation effects on vacancies and impurities—something of obvious concern—and also provide an initial baseline for hydrogenation parameters.

There has been work by Hughes et. al. (W. C. Hughes et al, *J. Elec. Mat.* 22 (8), p. 1101, 1993) on hydrogen interactions (and hence relevant to passivation) in bulk HgCdTe, by using perturbed γγ angular correlation (PAC). This work suggests that hydrogen acts mainly as an acceptor (when introduced from boiling water), interacts strongly with the In-Vacancy acceptor (in HgCdTe doped with In), but not with the bare In donor. There is also a report by Chen et. al. (Y. F. Chen et al, *Appl. Phys. Lett.* 59 (6) p. 703, 1991) on hydrogen passivation of bulk HgCdTe. Passivation was by plasma discharge and boiling in water. While the authors claim that Hg vacancies can be effectively passivated by atomic hydrogen, and that residual impurities or defects can be passivated in HgCdTe, the study was limited to infrared transmission spectra before and after hydrogenation. The study was inconclusive Cheung et. al. (J. T. Cheung et al, *J. Vac. Sci. Tech. B*10 (4), July/August, 1992) have briefly documented the effects of various gaseous species in the presence of UV light on the dark currents in HgCdTe short-wavelength infrared diodes and observed a detrimental change in the diode characteristics when they were exposed to hydrogen and UV radiation simultaneously. The authors surmised that the anomalous behavior of the UV-induced degradation of the diode characteristics in a hydrogen atmosphere was possibly due to several mechanisms. One possibility put forward was the continuous depletion of Hg and Te from the surface due to its reaction with atomic H. This process would thus create a Cd-rich layer which serves as an electrical shunt across the junction. Another possibility involved diffusion of atomic hydrogen into the bulk to alter the junction characteristics. In this instance it was believed that it could only be produced by UV-induced heterogeneous dissociation of hydrogen on the surface, since there was no Hg vapor to act as an energy sensitizer.

The finding by Cheung provided a hint of a method of introducing hydrogen into the HgCdTe epilayers. As disclosed below, the UV light can indeed lead to incorporation of hydrogen into the HgCdTe epilayer. However, we have discovered that the diode's degradation is a result of modification to the surface states enabling a leakage current to flow along the surface and not due to the hydrogen within the junction, or with Hg and Te depletion. The work by Cheung was on HgCdTe diodes grown on lattice matched ZnCdTe substrates.

What is needed is method and apparatus for passivating defects in semiconductors such as HgCdTe, such as those defects that arise from epitaxial growth of the semiconductor layers on a substrate that is not lattice-matched to the HgCdTe, and for realizing other benefits resulting from hydrogenation, including those benefits from hydrogen in improving electrical, optical and other properties.

SUMMARY OF INVENTION

Method and apparatus are provided for incorporating hydrogen into semiconductors. The surface of the semiconductor is simultaneously exposed to hydrogen (or deuterium) gas and ultraviolet (UV) light. The amount of hydrogen incorporated into the semiconductor is dependent on temperature, wavelength of the UV, time and the structure of the semiconductor. Masking of the UV light allows hydrogenation of selected areas. Electrical, optical and other properties of HgCdTe devices and other semiconductor materials may be improved by the hydrogenation process.

BRIEF DESCRIPTION OF THE DRAWINGS

FIG. 3 is a sketch of apparatus having an internal UV source for photon-assisted hydrogenation of thin films.

DETAILED DESCRIPTION

Figure 1:
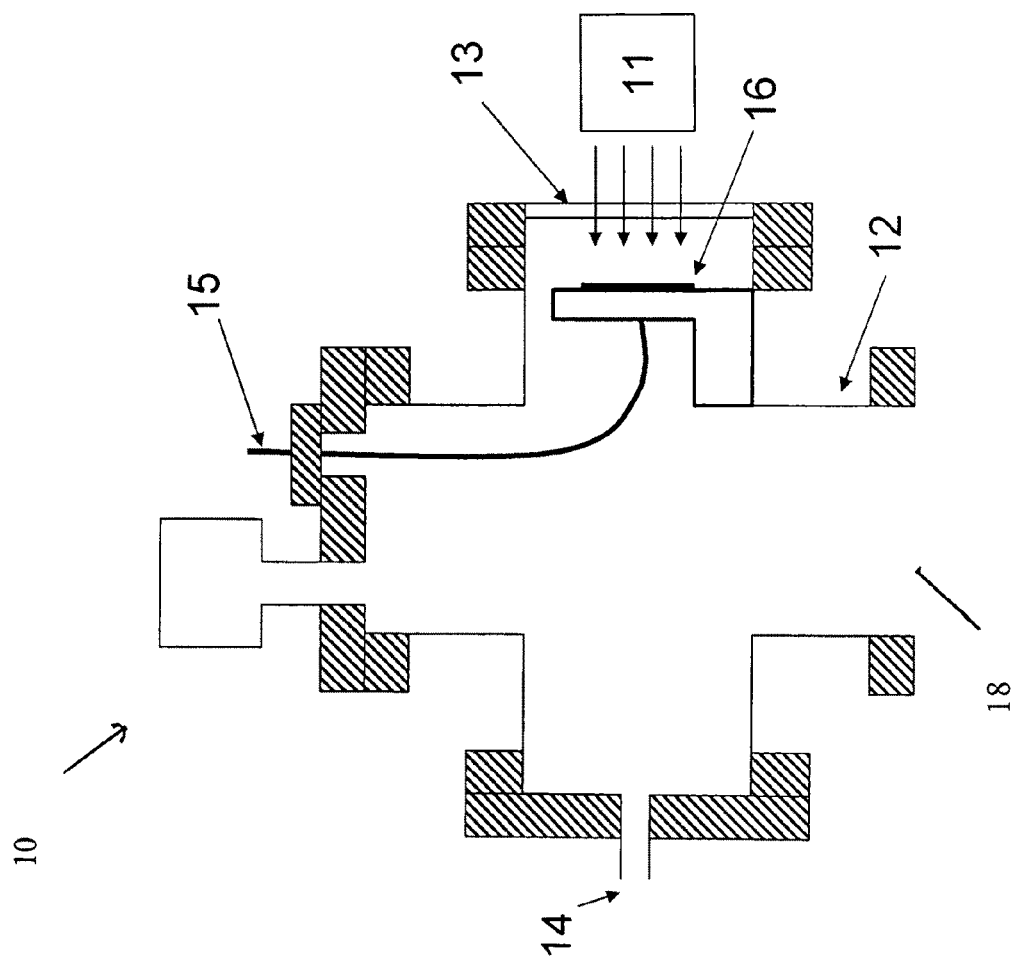
FIG. 1 IS A SKETCH OF APPARATUS HAVING AN OPTICAL WINDOW FOR UV-ASSISTED HYDROGENATION OF FILMS.

Apparatus suitable for UV hydrogenation of films is illustrated in FIG. 1. System 10 has chamber 12 and UV light source 11, which may be an Oriel 150W UV Xe arc lamp, (model 6254) or a mercury lamp. Chamber 12 may be wrapped with heating tape and aluminum foil (not shown) to achieve desired processing temperatures. The UV light passes into a deuterium environment in chamber 12 through 6-inch fused silica viewport 13, which allows for transmission of UV light down to wavelengths of about 200 nm. Gas inlet 14 provides for entry of hydrogen (or deuterium) gas. Thermocouple 15 allows measurement of temperature of sample 16. Opening 18 connects to a gate valve and a turbo pump (not shown).

Eight samples were treated under deuterium (D) at different temperatures (D, rather than H, was used to improve resolution, and distinguish from background H during Secondary Ion Mass Spectroscopy (SIMS) depth analysis). Two samples were heated under deuterium, but not exposed to UV, and were intended as control samples. Another control sample was completely untreated. The structure of the samples, the temperature of the test, and the environment are shown in Table I. Some samples were capped with CdTe.

Figure 2A:
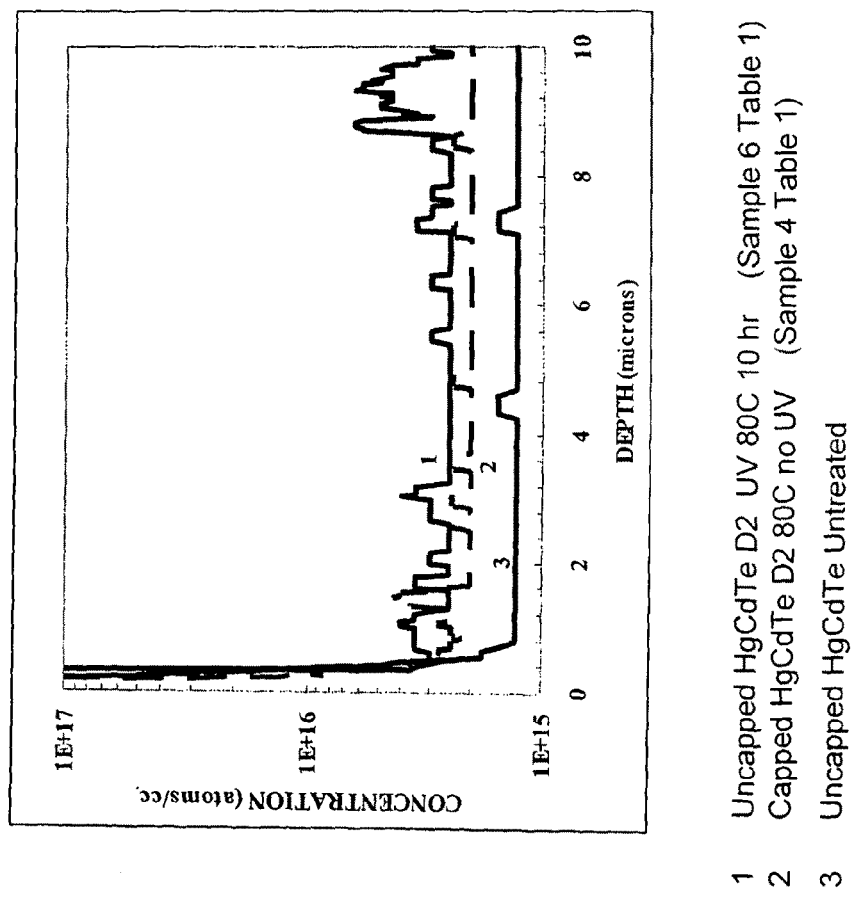
FIGS. 2(a) and 2(b) are graphs of concentration of deuterium in films treated in deuterium with and without UV radiation.
Figure 2B:
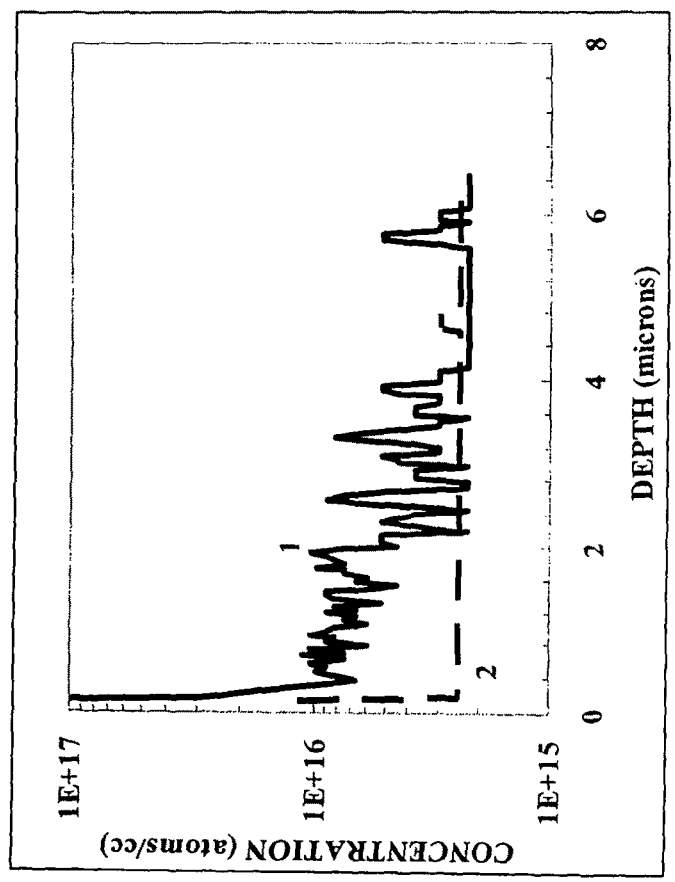

Sample temperatures were varied between 60-100° C. for samples with a CdTe capping layer and 60-80° C. for samples without the capping layer. Smoothed SIMS profile data for the two samples are shown in FIGS. 2(a) and 2(b). Deuterium pressure for all treatments was 761 Torr. With no UV, no deuterium was detected in the capped HgCdTe epilayer after treatment at 60° C. (curve 2 of FIG. 2(a)). With UV, an uncapped layer treated in deuterium for 10 hours at 80° C. showed some deuterium, but not as much as after treatments at a higher temperature. (curve 1 of FIG. 2(a)). An untreated sample showed no deuterium (curve 3 of FIG. 2(a))

When a capped film was irradiated with UV at 100° C. for 10 hours, deuterium concentration increased several-fold to a depth of 2 microns (curve 1, FIG. 2(b)). compared with an untreated sample (curve 2, FIG. 2(b)).

TABLE I

Structure and treatment conditions for UV hydrogenation studies.

| Sample | Structure | Temp/(° C.) | Environment* |
|---|---|---|---|
| 0 | CdTe/HgCdTe/Si, | 60 | No exposure |
| 1 | CdTe/HgCdTe/Si | 80 | D environment, UV exposure |
| 2 | CdTe/HgCdTe/Si | 100 | D environment, UV exposure |
| 3 | CdTe/HgCdTe/Si | 80 | D environment, UV exposure |
| 4 | CdTe/HgCdTe/Si | 60 | D environment, no UV |
| 5 | HgCdTe/Si, | 60 | D environment, UV exposure |
| 6 | HgCdTe/Si | 80 | D environment, UV exposure |
| 7 | HgCdTe/Si | 60 | D environment, no UV |
| 8 | HgCdTe/Si | 60 | D environment, UV exposure |

Two irradiation configurations and three different lamps were used to investigate the most effective way to perform the UV hydrogenation process. The primary difference between the two configurations was in the method of coupling the UV radiation to the sample surface. Both configurations utilized stainless steel vacuum chambers, which were evacuated and then backfilled with the hydrogen (or deuterium) process gas. In the first configuration the UV source was outside the vacuum chamber and the UV light was transmitted into the vacuum chamber through a UV quartz viewport, as illustrated in FIG. 1. In the second configuration the UV lamp was mounted such that the quartz viewport was not in the beam. A sketch of the second system and the sample holder is shown in FIG. 3. Lamp 52 used was a deuterium lamp made by Hamamatsu. This lamp is especially well suited for UV hydrogenation (using deuterium). In addition to shorter wavelength output than the Hg or Xe lamps, the lamp comes mounted inside a conflat vacuum flange for direct mounting to a vacuum chamber. This allows direct sample illumination through magnesium fluoride lamp window 54. The chamber is usually wrapped with heating tape and aluminum foil to achieve hydrogenation processing temperatures (60-100° C.). Sample 56 sits under UV lamp 52. This arrangement eliminates the viewport transmission losses, which can be significant below 200 nm.

The characteristics of the lamps used are shown in Table II.

TABLE II

A comparison of the three UV sources used in this study.

| | | Dominant Spectral Range | |
|---|---|---|---|
| Lamp | Coupling | nm | eV |
| 200 W Hg | External | >230 | <5.4 |
| 150 W Xe | External | >200 | <6.2 |
| 30 W $D_2$ | Internal | 115-170 | 7.3-10.8 |

Figure 4:
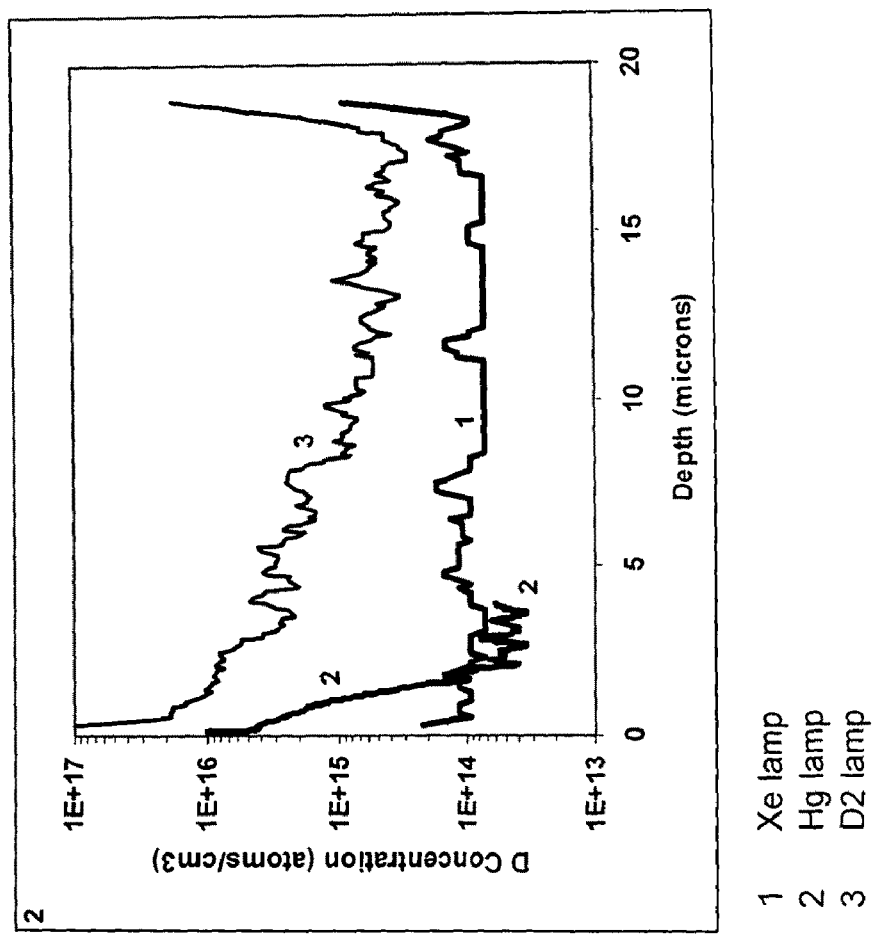
FIG. 4 is a graph of deuterium concentration vs. depth after exposure to different UV lamps during hydrogen exposure.

SIMS depth profiling was used to detect the presence of deuterium within the samples after UV treatment. FIG. 4 shows SIMS depth profiles for hydrogenation of HgCdTe using three different lamps. Curve 1 shows data for the xenon lamp, curve 2 for the Hg lamp and curve 3 for the deuterium lamp. The deuterium lamp is the most effective in hydrogenation of the sample. Use of the deuterium UV source resulted in a dramatic increase in the amount of deuterium incorporation compared to similar treatments using the Hg or Xe lamps. All three samples were from the same wafer, and were given similar treatments (80° C., 48 hours) except for the UV source. Although not being bound by an explanation, we believe that the deuterium lamp is the most effective because of the natural energy resonances of the photon source with the deuterium gas.

FIG. 4 shows two or three traces for each type lamp. These data were obtained at different locations on a film, and indicate different concentrations of deuterium at different locations on the film. The question arises as to whether the areal variation of hydrogenation is indicative of process non-uniformity or whether it reflects non-uniformity in the sample. Subsequent evidence suggested that this variation was related to the number of visible defects in the spot being profiled. This was determined by microscope inspection of the SIMS pits to look for defects in the area under analysis. After the SIMS depth profiling, the bottom of each milled pit was inspected for defects. Microscope pictures of these pits show that the lowest concentration profile corresponded to the lowest defect count. This correspondence between defects and deuterium concentration was consistent whenever such post-SIMS inspections were performed.

Use of the deuterium lamp allows the UV hydrogenation process to be studied under a completely different range of wavelengths than either the Xe or Hg lamps. In order to couple this very shortwave UV radiation to the sample surface it was necessary to use the arrangement shown in FIG. 3.

Figure 5:
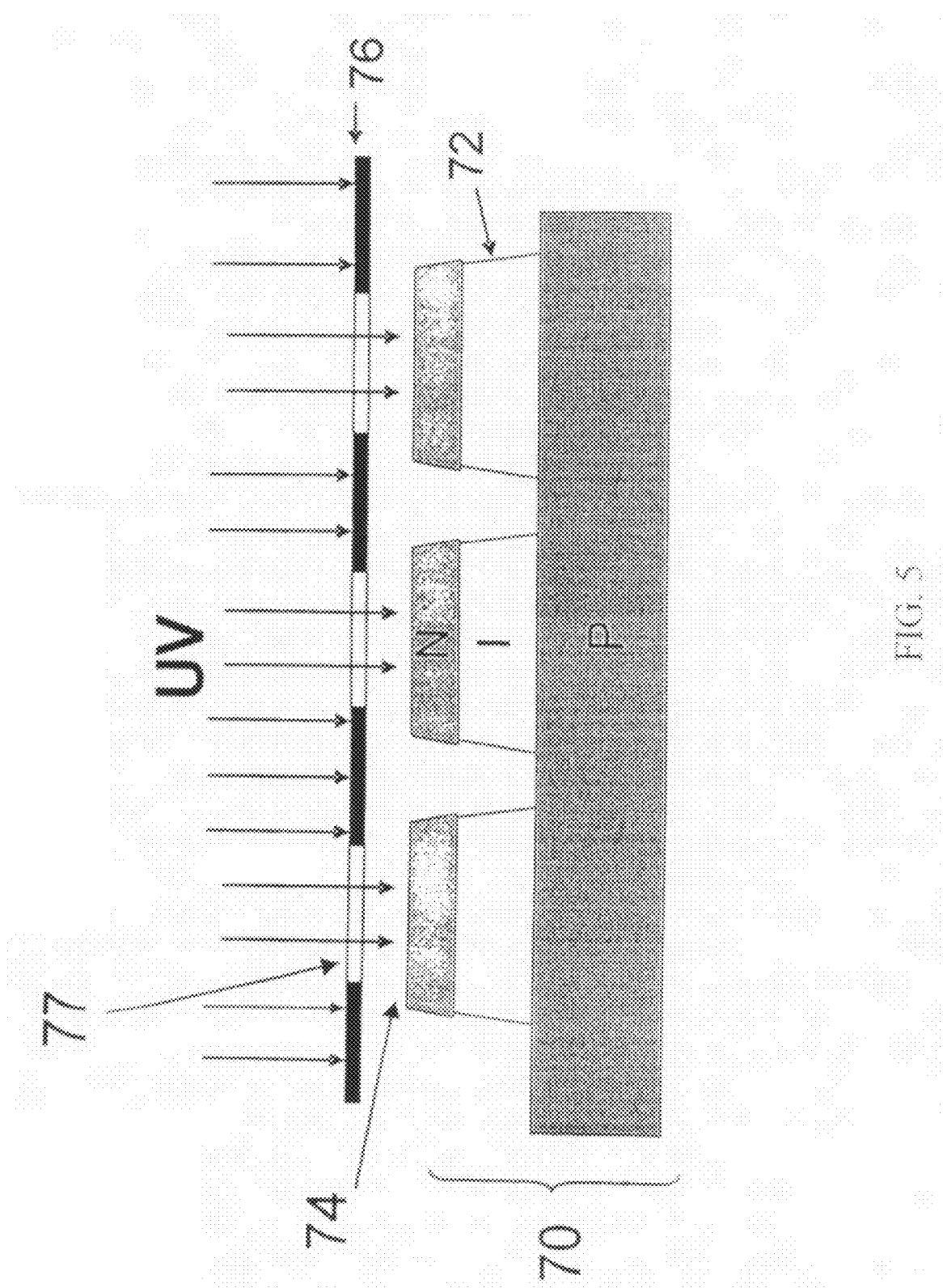
FIG. 5 is a sketch showing selective hydrogenation of an avalanche photodiode array using a mask.

IR detectors employing HgCdTe are normally avalanche photodiode (APD) arrays, as represented in FIG. 5. The UV hydrogenation plan for these arrays originally called for selective hydrogenation along the sidewalls 72 of the diode mesas, while mesa tops 74 would be masked from UV irradiation. It was determined that it is preferable to mask sidewalls 72 and to hydrogenate mesa tops 74. This is based on the fact that hydrogenation tends to increase surface conductivity, and operation of the avalanche photodiodes requires that a high field be maintained across the avalanche layer. On the other hand, hydrogenation on the mesa tops may be very beneficial in improving the electrical characteristics.

Referring to FIG. 5, to perform selective hydrogenation of a chip, after chip 70 has been selected, mask designers may design mask 76 that will allow hydrogenation only at the top of each mesa. Openings 77 in mask 76 correspond to the mesa tops on corresponding APD array 70. The mask may contain different array structures that may differ from one another in the size of the openings. The larger openings will cover more of the mesa top, and will help with hydrogenating around bumps on top of the mesa. But the larger openings will also require more precise alignment in order to insure that no sidewall is exposed. After a determination of alignment accuracy and mask shift during heating, the opening size for the APD array may be selected. The mask may have alignment marks displaced diagonally from each of the four corners in the array of openings. These alignment marks may correspond to alignment marks oil the chip, and can be used to insure that the openings in the mask are aligned with the mesas in the photodiode array.

Figure 6:
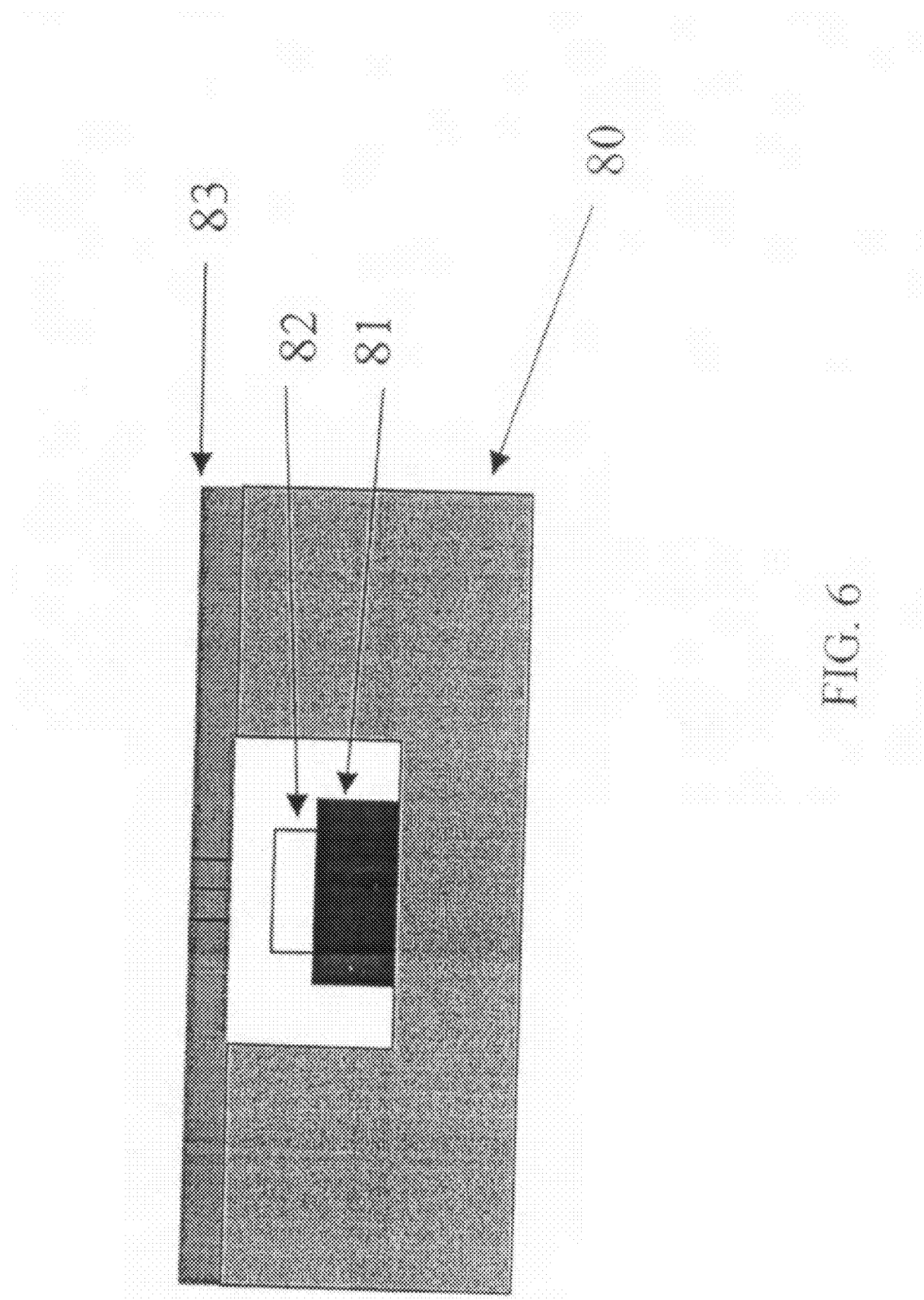
FIG. 6 is a sketch of apparatus for locating a mask and a film to be irradiated with UV.

The key to the selective area hydrogenation is to have the mask openings aligned with the mesa tops under the UV lamp in the hydrogenation chamber. An in situ alignment procedure may be used or a mask and chip may be aligned in a rigid mount outside the treatment chamber and then transferred inside the treatment chamber. This mount is illustrated in FIG. 6. Mount 80 includes a recessed region that may be milled in a solid block of aluminum. X-Y translation stage 81 is mounted inside this recess, and APD chip 82 is mounted oil top of the X-Y stage. Mask 83 is then mounted to the Al block above the chip. The mount is then viewed under a microscope, and micrometer movements on the X-Y translation stage are used to align the openings in the mask with the mesas in the array.

After alignment is achieved, X-Y stage 81 may be locked rigidly in place and the whole mount transferred into the hydrogenation chamber and placed under the UV lamp for hydrogenation. Preferably, the APDs are hydrogenated prior to a bumping procedure.

Although the use of UV photo-assisted hydrogenation has been discussed with respect to HgCdTe devices to be used as IR detectors, it should be understand that the technique may be applied to other semiconductor devices for other uses, such as the use of hydrogenation as a self-healing mechanism for radiation hardening of HgCdTe detectors in the space environment and for other semiconductors where changes in the electrical or optical properties of the materials are needed.

Standard processing consists of chamber evacuation and outgassing through a turbo pump, after which the sample is heated to the desired temperature and the chamber backfilled with deuterium (or hydrogen) gas. The UV source may then be ignited and the sample irradiated in the deuterium environment. In some applications, the entire sample surface may be UV irradiated.

In summary, the SIMS results have shown that (a) hydrogenation of HgCdTe can be activated by UV irradiation, (b) the concentration of D tends to correspond with the local defect density, and (c) the extent of hydrogenation depends on both temperature and the photon wavelength.

Using the apparatus and procedures disclosed herein a comprehensive UV Hydrogenation Parameter Matrix for HgCdTe may be developed. This will allow a user to design and tailor the hydrogenation process for the variety of HgCdTe materials encountered in various devices. HgCdTe of varying alloy content is used for NIR, SWIR, MWIR, LWIR and VLWIR. An understanding of the different parameters required for this range of HgCdTe alloys may be developed by combining data acquired from six trusts: a parameter data set for UV intensity, hydrogen pressure, temperature and time; an assessment of lateral diffusion profiles and shadow mask delineation capability; an investigation of uptake differences for the range of HgCdTe alloys used and PAH process parameters; an investigation of differences between p and n-type material; an investigation of H uptake in HgCdTe/Si and HgCdTe/ZnCdTe; and an investigation of uptake in HgCdTe grown by MBE and LPE.

A commercial 'plug-and-play' system for Photon-Assisted Hydrogenation (PAH) for treatment of APDs or FPA's may be assembled, using a customized reaction chamber uniquely designed for PAH with masking and alignment capability. This may include a UHV process chamber and pumping station capable of high vacuum evacuation to low levels of residual background gases.

Hydrogenation of semiconductor materials has been disclosed heretofore. It should be understood, however, that the same process may be applied to other materials that may benefit from hydrogenation. For example, ceramics, metals, carbon structures (such as graphite, natural or synthetic diamond and carbon-60 structures) and other materials may be hydrogenated more effectively by application of the photo-assisted process described herein. Further, selected areas of a material may be hydrogenated by the methods disclosed herein.

Although the present invention has been described with reference to specific details, it is not intended that such details should be regarded as limitations on the scope of the invention, except to the extent that they are included in the accompanying claims.

We claim:

1. A process for hydrogenating a semiconductor, wherein the semiconductor is part of a chip having mesa tops in an array, the process comprising:
   a) providing a vacuum chamber having a sample holder and a source of UV light disposed to provide UV radiation on the sample holder;
   b) placing the semiconductor on the sample holder, degassing the chamber and introducing hydrogen gas to a selected pressure;
   c) placing a mask having a selected pattern between the source of UV light and the semiconductor, wherein selected pattern of the mask provides a selective irradiation of the mesa tops; and
   radiating the semiconductor with ultraviolet light for a selected time, wherein the wavelength of the ultraviolet light is less than about 200 nm.

2. The process of claim 1 wherein the temperature of the semiconductor is controlled in a selected range.

3. The process of claim 1 wherein the array is a part of an avalanche photodiode.

4. The process of claim 1 further comprising aligning the mask to a selected location with respect to the semiconductor.

5. A process for hydrogenating a metal, ceramic or carbon-based material, wherein the material is part of a chip having mesa tops in an array, the process comprising:
   a) providing a vacuum chamber having a sample holder and a source of UV light disposed to provide UV radiation on the sample holder;
   b) placing the metal, ceramic or carbon-based material on the sample holder, degassing the chamber and introducing hydrogen gas to a selected pressure;
   c) placing a mask having a selected pattern between the source of UV light and the metal, ceramic or carbon-based material wherein the selected pattern of the mask provides selected irradiation of the mesa tops; and
   d) radiating the metal, ceramic or carbon-based material with ultraviolet light for a selected time, wherein the wavelength of the ultraviolet light is less than about 200 nm.

6. The process of claim 5 wherein the temperature of the metal, ceramic or carbon-based material is controlled in a selected range.

7. A process for hydrogenating selected areas of a material, wherein the material is part of a chip having mesa tops in an array, the process comprising:
   a) providing a vacuum chamber having a sample holder and a source of UV light disposed to provide UV radiation on the sample holder;
   b) placing the material on the sample holder, degassing the chamber and introducing hydrogen gas to a selected pressure;
   c) placing a mask having a selected pattern between the source of UV light and the material, wherein the selected pattern of the mask provides selective irradiation of the mesa tops; and
   d) radiating the material with ultraviolet light for a selected time, wherein the wavelength of the ultraviolet light is less than about 200 nm.

8. The process of claim 7 wherein the temperature of the material is controlled in a selected range.

* * * * *